United States Patent [19]

Rizzo

[11] Patent Number: 4,787,097
[45] Date of Patent: Nov. 22, 1988

[54] NRZ PHASE-LOCKED LOOP CIRCUIT WITH ASSOCIATED MONITOR AND RECOVERY CIRCUITRY

[75] Inventor: Raymond P. Rizzo, Vestal, N.Y.

[73] Assignee: International Business Machines Corporation, Armonk, N.Y.

[21] Appl. No.: 13,598

[22] Filed: Feb. 11, 1987

[51] Int. Cl.⁴ .............................................. H04L 7/02
[52] U.S. Cl. ...................... 375/120; 328/155; 331/11
[58] Field of Search ................ 375/120, 87, 81, 110, 375/82, 118, 108; 328/155; 307/271; 331/17, 11, 1 A, 25

[56] References Cited

U.S. PATENT DOCUMENTS

| | | | |
|---|---|---|---|
| 3,571,712 | 3/1971 | Hellwarth et al. | 375/82 |
| 3,723,888 | 3/1973 | Ellis | 328/134 |
| 3,731,204 | 5/1973 | Deligniers | 328/134 |
| 4,088,832 | 5/1978 | Eastmand | 375/87 |
| 4,191,976 | 3/1980 | Braun | 360/51 |
| 4,301,537 | 11/1981 | Roos | 375/108 |
| 4,365,211 | 12/1982 | Lee | 307/517 |
| 4,404,530 | 9/1983 | Stryer | 331/1 A |
| 4,466,108 | 8/1984 | Rhodes | 375/118 |
| 4,484,152 | 11/1984 | Lee | 331/1 A |
| 4,542,351 | 9/1985 | Oxada | 331/11 |
| 4,562,411 | 12/1985 | O'Rourke et al. | 331/25 |
| 4,590,602 | 5/1986 | Wolaver | 375/120 |
| 4,593,254 | 6/1986 | Coburn | 331/1 A |
| 4,596,963 | 6/1986 | Lawton et al. | 331/25 |
| 4,633,488 | 12/1986 | Shaw | 331/1 A |
| 4,636,748 | 1/1987 | Latham, II | 331/17 |

Primary Examiner—Robert L. Griffin
Assistant Examiner—Marianne Huseman
Attorney, Agent, or Firm—Curtis G. Rose; M. H. Klitzman

[57] ABSTRACT

Monitor circuitry is placed in the closed loop of a phase-locked loop (PLL) circuit and is capable of detecting the existence of an out of frequency window condition and outputting a control signal when the PLL is operating outside the predetermined narrow frequency window. Recovery circuitry, including a phase frequency detector with a wide acquisition range, temporarily replaces the normal phase detector of the PLL, responsive to the control signal from the monitor circuitry. When the monitor circuitry determines that the PLL is back within the predetermined narrow frequency window, the PLL phase detector is switched back into the PLL loop and the phase frequency detector is removed from the PLL loop. The PLL phase detector is then able to lock in on the incoming data stream. In the preferred embodiment, the monitor and recovery circuitry and connected to a specialized PLL circuit which utilizes a 180 degree phase difference between incoming NRZ data and the recovered clock to strobe the data in the center of the input data pulse, thus improving the data error rate.

17 Claims, 5 Drawing Sheets

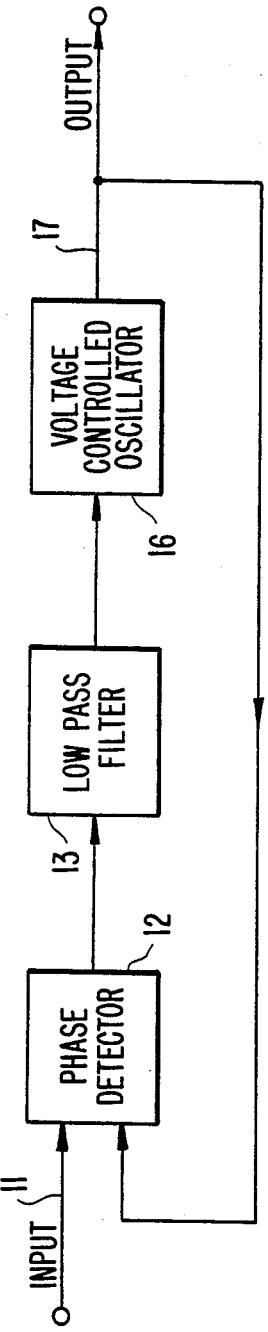
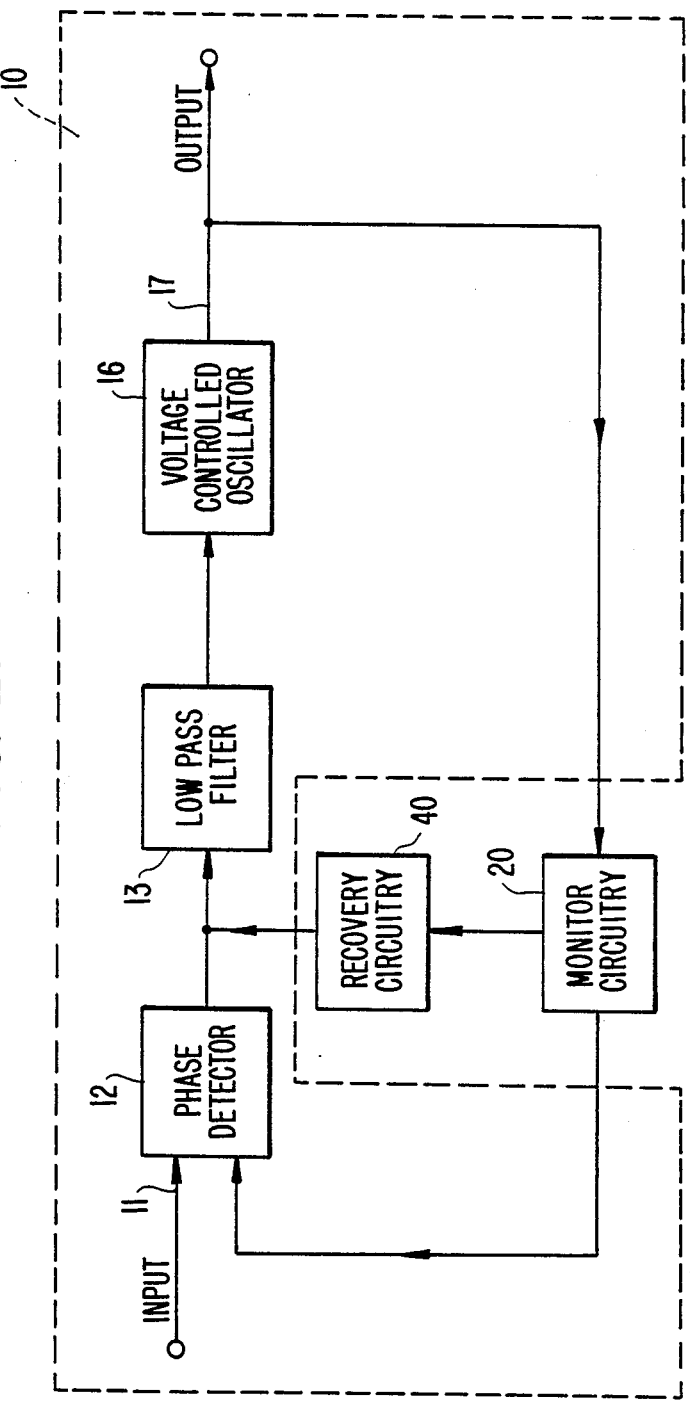
FIG. 1. (PRIOR ART)
FIG. 2.

NRZ PHASE-LOCKED LOOP CIRCUIT WITH ASSOCIATED MONITOR AND RECOVERY CIRCUITRY

FIELD OF THE INVENTION

This invention relates to a method and apparatus for monitoring a phase-locked loop circuit (PLL), and recovering the lock condition of the phase-locked loop circuit. More particularly, this invention efficiently and reliably obtains clocking signals from a data stream, especially a non-return to zero (NRZ) data stream.

DESCRIPTION OF THE RELATED ART

In order to decode the high speed serial transmission of data in a data stream, clocking information relating to the data must be obtained. The clocking information can either be sent separately from the data or extracted directly from the data. A phase-locked loop circuit is often used to extract clocking information directly from the data stream. The phase-locked loop circuit normally contains a phase detector, a low pass filter, and a voltage controlled oscillator (VCO). A recovered clock signal can be obtained at the output of the VCO, since the closed loop nature of the PLL converges the VCO output to the base frequency of the input signal.

If the input signal is a periodic waveform, such as a simple sine wave, the PLL has no difficulty locking in on its base frequency, since there are no harmonic components of a periodic signal. However, when the input signal is random data, many harmonic components of the signal are also part of the spectral content, in addition to the base frequency rate of the random data. The PLL must only lock in on the base frequency of the random data and not any harmonic components of the random data. Therefore, the frequency acquisition range of the PLL must be limited to a narrow band centered around the base frequency of the random data, so that the PLL cannot falsely lock in on a harmonic component.

In the past, the components of the PLL had to be carefully selected, manually trimmed or actively trimmed during a test phase to limit the acquisition range of the PLL. This is a time consuming and expensive task. Time and temperature can also expand the acquisition range of the PLL wide enough to false lock on a harmonic component.

Another problem with the use of a PLL with a narrow acquisition range is the difficulty a PLL circuit has in obtaining a locked condition upon initialization, or in regaining a locked condition upon a disruption of transmission, such as when a cable is pulled out. Unless the VCO output frequency is within the acquisition range, a PLL will often drift about aimlessly never able to lock in on the base frequency of the incoming data.

The problems of maintaining a proper lock condition on a random data stream are compounded when the random data stream is a NRZ data stream. NRZ data does not necessarily have a spectral frequency component at the frequency the data stream is sent. Special modifications must be done to the PLL to allow it to handle a NRZ data stream.

In addition, the error rate of NRZ data should be as low as possible, preferably in the order of $10^{-15}$. For this error rate to be achieved, there can only be one error every two or three months in a processor running 24 hours a day at a data rate of 200 million bits per second. Special modifications must be done to the PLL to achieve such an error rate.

There have been several attempts in the past to solve the above problems. U.S. Pat. No. 4,365,211 discloses a PLL with a primary loop and an initialization loop. The initialization loop is switched into the circuit when a frequency window is exceeded. However, the frequency window is created by using imprecise elements such as capacitors and resistors, thus being unsuitable for random data, such as NRZ data, which requires a precise and narrow frequency window.

U.S. Pat. No. 4,590,602 discloses a wide range clock recovery circuit for NZ data. However, this patent uses quadature phase detectors, which produces a 90 degree phase difference between data and the recovered clock. This is undesirable, since the input data is strobed on the pulse edge, which can result in data errors that exceed a desirable error rate. In addition, the monitor circuitry monitors differences in phase instead of frequency. This approach is undesirable for loop initialization due to insensitivity between input and output data patterns.

SUMMARY OF THE INVENTION

It is the principal object of this invention to monitor a PLL circuit, precisely determine when a narrow frequency window has been exceeded and assist the PLL to rapidly and efficiently relock on a random data stream.

It is another object of this invention to determine when a narrow frequency window has been exceeded and assist a specially designed PLL to rapidly and efficiently relock on a NRZ data stream.

These and other objects are accomplished by the monitor and recovery circuit disclosed herein. Monitor circuitry is placed in the closed loop of a PLL circuit and is capable of detecting the existence of an out of frequency window condition and outputting a control signal when the PLL is operating outside the predetermined narrow frequency window. Recovery circuitry, including a phase frequency detector with a wide acquisition range, temporarily replaces the normal phase detector of the PLL, responsive to the control signal from the monitor circuitry. When the monitor circuitry determines that the PLL is back within the predetermined narrow frequency window, the PLL phase detector is switched back into the PLL loop and the phase frequency detector is removed from the PLL loop. The PLL phase detector is then able to lock in on the incoming data stream. In the preferred embodiment, the monitor and recovery circuitry are connected to a specialized PLL circuit which utilizes a 180 degree phase difference between incoming NRZ data and the recovered clock to strobe the data in the center of the input data pulse, thus improving the data error rate.

BRIEF DESCRIPTION OF THE DRAWING

FIG. 1 shows a asic PLL circuit.

FIG. 2 shows the monitor circuitry and recovery circuitry of the subject invention placed in the loop of a basic PLL circuit.

DESCRIPTION OF THE PREFERRED EMBODIMENT

Figure 3:
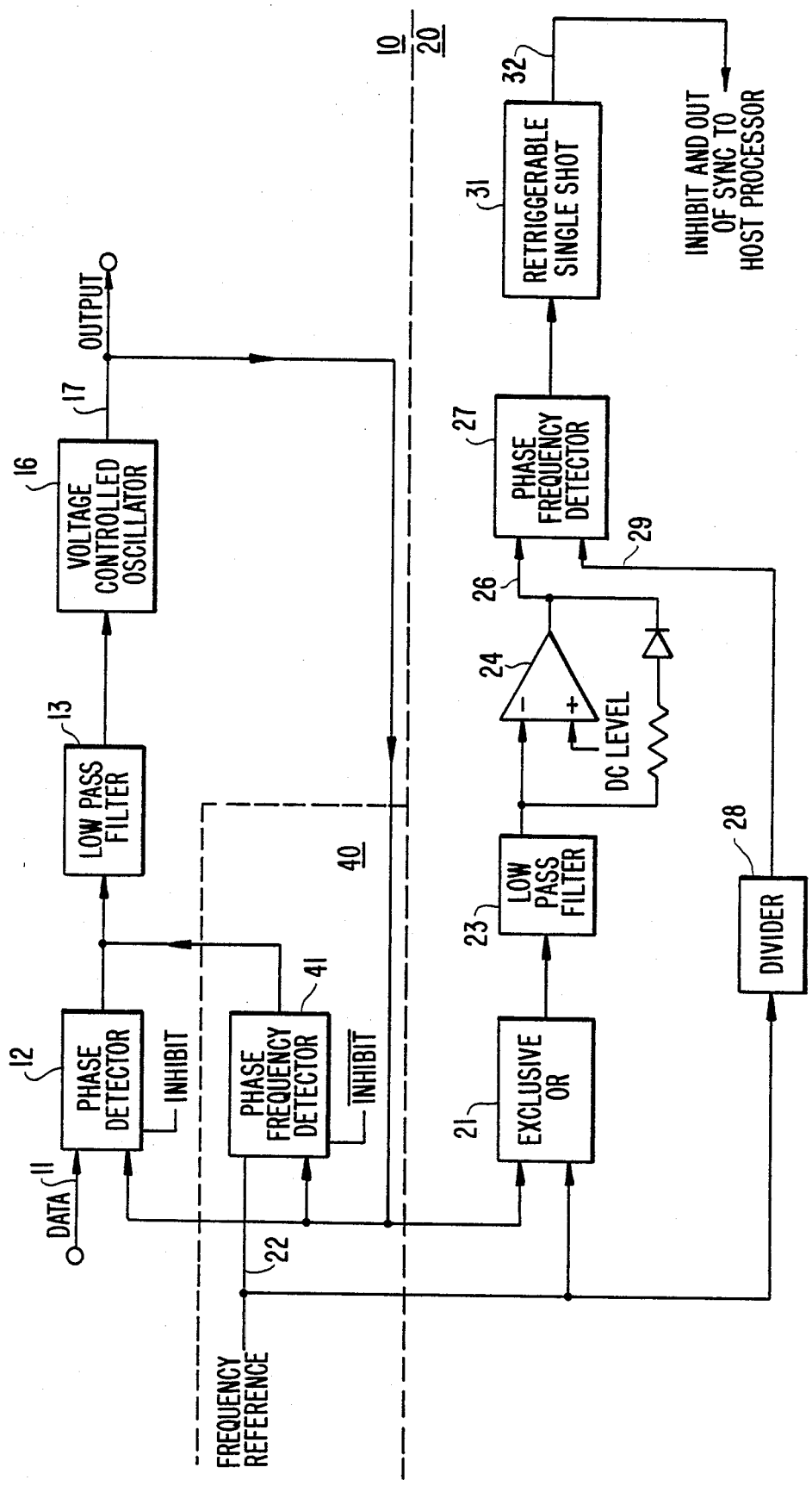
FIG. 3 shows the specifice components of the monitor circuitry and recovery circuitry of FIG. 2.

FIG. 1 shows basic phase-locked loop (PLL) circuit 10. Phase detector 12, low pass filter 13 and voltage controlled oscillator (VCO) 16 are connected together in the forward path of the loop. Output line 17 feeds back to phase detector 12. VCO 16 is a free running oscillator controlled by an external reference frequency (not shown). The frequency of VCO 16 feeds back to phase detector 12 on PLL output line 17. Phase detector 12 compares the PLL output frequency with the input frequency of the signal on input line 11.

The output of phase detector 12 is an average DC voltage proportional to the difference in frequency and phase of input line 11 and output line 17, commonly called the error signal. The high frequency noise of the error signal is filtered by low pass filter 13. The filtered error signal is then supplied to VCO 16, completing the loop and forcing VCO 16 to adjust its frequency to reduce the difference between the VCO frequency and the input frequency on input line 11. When VCO 16 begins to change its frequency, loop 10 is in its acquisition state.

Loop 10 stays in acquisition state and the process of adjusting the frequency of VCO 16 continues until the VCO frequency present on output line 17 is the same as the input frequency present on input line 11. Once these two frequencies are the same (except for a finite phase difference), the loop is locked, or in synchronization.

The range over which loop 10 will follow changes in the input frequency of input line 11 is called the lock range. The frequency range in which loop 10 acquires phase-lock is the acquisition range. The acquisition range in loop 10 is never greater than the lock range. If the error signal is too large, indicating a large difference in frequency between the VCO frequency and the input line frequency, low pass filter 13 will not pass this error signal on to VCO 16, as the acquisition range has been exceeded.

If the input signal on input line 11 was a 200 MHz sinusoidal signal, the acquisition range of loop 10 could theoretically be infinite, since there is no danger of false locking on a harmonic component of a pure sinusoidal signal. When the acquisition range is large, loop 10 is more likely to be able to lock in on an incoming signal during initialization.

However, if the input signal on input line 11 is a random digital data stream, the acquisition range of loop 10 must be set precisely to be much narrower than in the case of a sinusoid signal, since there is now a danger of false locking on a harmonic component. When the acquisition range is small, loop 10 would not be able to lock in on an incoming signal during initialization.

FIG. 2 shows monitor circuitry 20 and recovery circuitry 40 placed inside loop 10 of FIG. 1. Monitor circuitry 20 monitors PLL output line 17 and is capable of determining if PLL 10 is operating within the predetermined narrow frequency window. The predetermined narrow frequency window is slightly less than the acquisition range of the PLL to account for component tolerances. If monitor circuitry 20 determines that PLL 10 is operating inside the predetermined narrow frequency window, output line 17 arrives at phase detector 12 unchanged by monitor circuitry 20. However, if monitor circuitry 20 determines that PLL 10 is operating outside the predetermined narrow frequency window, recovery circuitry 40 is enabled and phase detector 12 is disabled. When the loop is in this unlocked condition, data on input line 11 is halted, since phase detector 12 is disabled. Recovery circuitry 40 remains in the loop circuit until monitor circuitry 20 determines that the loop is again operating inside the frequency window, thus also within the acquisition range of phase detector 12, whereupon phase detector 12 is again enabled and recovery circuitry 40 is disabled. Phase detector 12 then locks in on the frequency of the incoming data.

FIG. 3 describes the operation of monitor circuitry 20 and recovery circuitry 40 in more detail. PLL output line 17 arrives at an input of EXCLUSIVE OR (XOR) 21. Frequency reference signal 22 is present at the other input of XOR 21. Frequency reference signal 22 corresponds to the transmission rate of the incoming data.

XOR 21 produces a digital signal that contains the sum and difference of the PLL output frequency on line 17 and the reference frequency on line 22. This digital signal is passed through low pass filter 23, which filters out the sum of PLL output frequency and the reference frequency. The signal at the output of low pass filter 23 is an analog signal of the frequency difference between the PLL output frequency and the reference frequency. This analog signal is then transformed back into a digital signal by comparator 24, which arrives on input line 26 of phase frequency detector 27. Comparator 24 uses hysterisis to avoid false triggering should the signals on frequency reference line 22 and on PLL output line 17 approach synchronization.

Frequency reference signal 22 is divided by divider 28 so that the frequency of the signal present on line 29 is slightly narrower than the acquisition range of the PLL circuit. The frequency of the signal present on line 29 determines the frequency window. Therefore, phase frequency detector 27 has at input line 26 a signal representing the frequency difference between the PLL output frequency and the reference frequency, and at input line 29 a signal representing the frequency window. Phase frequency detector 27 compares input line 26 with input line 29.

If input line 26 contains a higher frequency than input line 29, the PLL circuit is operating outside the predetermined narrow frequency window, since the difference between the PLL output and the frequency reference signal exceeds the frequency window. Retriggerable single shot 31 then enables inhibit line 32. The use of retriggerable single shot 31 avoids the possibility of inhibit line 32 toggling during an out of frequency window condition.

When inhibit line 32 is enabled, indicating that the PLL is operating outside the predetermined narrow frequency window, phase detector 12 is turned off, and phase frequency detector 41 is turned on. Phase frequency detector 41 effectively then takes the place of phase detector 12 in the PLL circuit. Phase frequency detector 41 compares frequency reference 22 to the PLL output signal 17. Phase frequency detector 41 has a wide acquisition range, (theoretically infinite up to the practical limitations of the phase frequency detector) and the frequency of VCO 16 is continuously adjusted to be closer to the frequency of frequency reference 22.

Monitor circuitry 20 continues to monitor the PLL while phase frequency detector 41 takes the place of phase detector 20. When the frequency of input line 26 of phase frequency detector 27 is smaller than the frequency of input line 29, the PLL circuit is back within the frequency window, thus also back within the acquisition range of phase detector 12, since the difference between the PLL output and the frequency reference signal is less than the acquisition range of phase detector 12. Retriggerable single shot 31 then disables inhibit line 32.

When inhibit line 32 is disabled, indicating a within frequency window condition, phase detector 12 is turned back on, and phase frequency detector 41 is turned off. Phase detector 12 effectively then takes the place of phase frequency detector 41 in the PLL circuit. Phase detector 12 is then able to lock into the proper frequency, since the PLL circuit is within its acquisition range.

A simple example of the operation of the invention will now be disclosed. Assume random data enters phase detector 12 on input line 11 at 200 mbits. In order to perform clock recovery on data at this high speed, VCO 16 must run at 200 MHz. Frequency reference 22 also then runs at 200 MHz. Assume pase detector 12 has an acquisition range of 1.5 MHz, necessarily narrow due to the harmonics close to the base frequency spectral component. This 1.5 MHz acquisition range means that phase detector 12 only has the ability to move VCO 16 by 1.5 MHz from wherever it starts from; therefore, to lock properly on incoming data VCO 16 must be initialized to within 1.5 MHz of 200 MHz.

In order to define the frequency window, input line 29 of phase frequency detector 27 should contain a frequency less than the 1.5 MHz acquisition range of phase detector 12. Therefore, a 1 MHz frequency window would be appropriate. Since the frequency of frequency reference 22 is 200 MHz, divider 28 should divide the incoming frequency by 200.

Upon initialization, assume VCO 16 starts up at 50 MHz. Proper data recovery cannot be accomplished at this frequency, since it is not within 1.5 MHz of 200 MHz, the acquisition range of phase detector 12. The output of XOR 21 contains the sum and difference of PLL output line 17 (50 MHz) and frequency reference 22 (200 MHz), which is 250 MHz and 150 MHz, respectively. Low pass filter 24 removes the 250 MHz frequency component. Therefore, a signal of 150 MHz is present at input line 26 of phase frequency detector 27. Input line 29 contains a signal having a frequency of 1 MHz, the frequency window. Since input line 26 is larger than input line 29, phase frequency detector determines that the PLL is operating outside the 1 MHz frequency window, and enables inhibit line 32, thus shutting off phase detector 12 and turning on phase frequency detector 41.

Phase frequency detector 41 with its wide acquisition range and 200 MHz frequency reference signal 22 as its input, is now part of the PLL circuit. The frequency of VCO 16, still at 50 MHz, begins to increase and approach 200 MHz. When the frequency of the signal present at PLL output line 17 exceeds 199 MHz, input line 26 of phase frequency detector 27 is less than the frequency of the signal present at input line 29, indicating that the PLL is within the 1 MHz frequency window, as well as the 1.5 MHz acquisition range of phase detector 12. Inhibit line 32 is disabled, thus turning off phase frequency detector 41 and turning back on phase detector 12. Since VCO 16 is now within the acquisition range of phase detector 12, the PLL circuit is able to lock in on the 200 mbit data arriving on input line 11.

Figure 4:
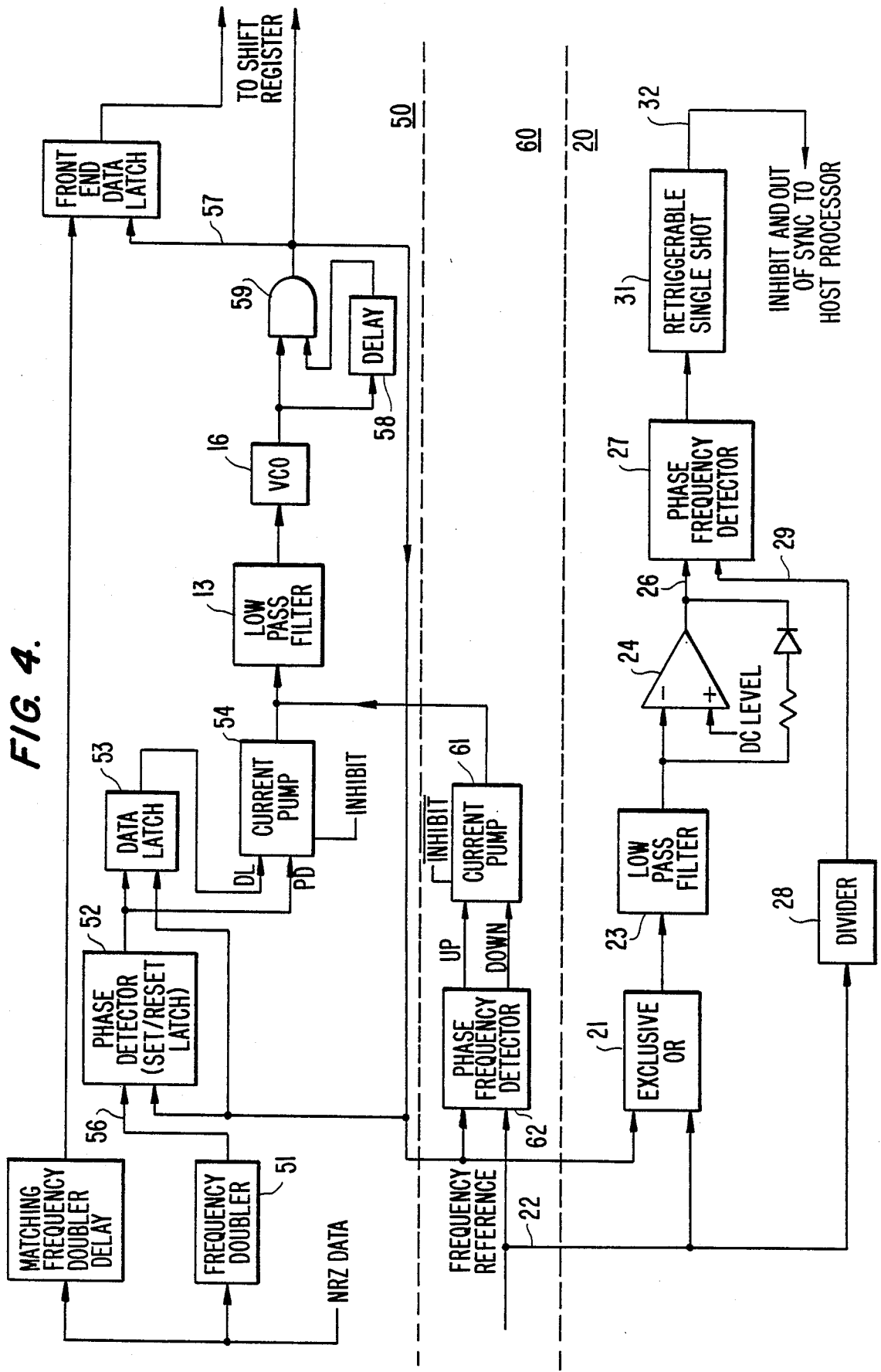
FIG. 4 shows modified monitor circuitry and recovery circuitry connected to a modified PLL circuit capable of handling a NRZ data stream.
Figure 5:
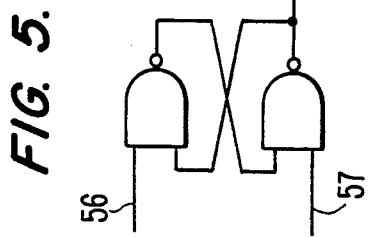
FIG. 5 shows the detailed circuitry of the phase detector of FIG. 4.

The preferred embodiment of the use of the monitor and recovery circuit, with a specialized PLL circuit modified for NRZ data is shown in FIG. 4. FIG. 4 shows PLL circuit 50 connected to monitor circuit 20 and recovery circuit 60. Frequency doubler 51 extends the acquisition range of phase detector 52. Frequency doubler 51 also creates narrow pulses required by phase detector 52 for optimal operation. This doubled frequency signal arrives at phase detector 52. Phase detector 52, a modified set/reset latch, is shown in more detail in FIG. 5.

The output of phase detector 52 creates a digital error signal between the input signal from frequency doubler 51 and phase locked loop output line 57. Data latch 53 senses missing pulses inherent in a random NRZ data stream by strobing the output of phase detector 52.

Figure 6:
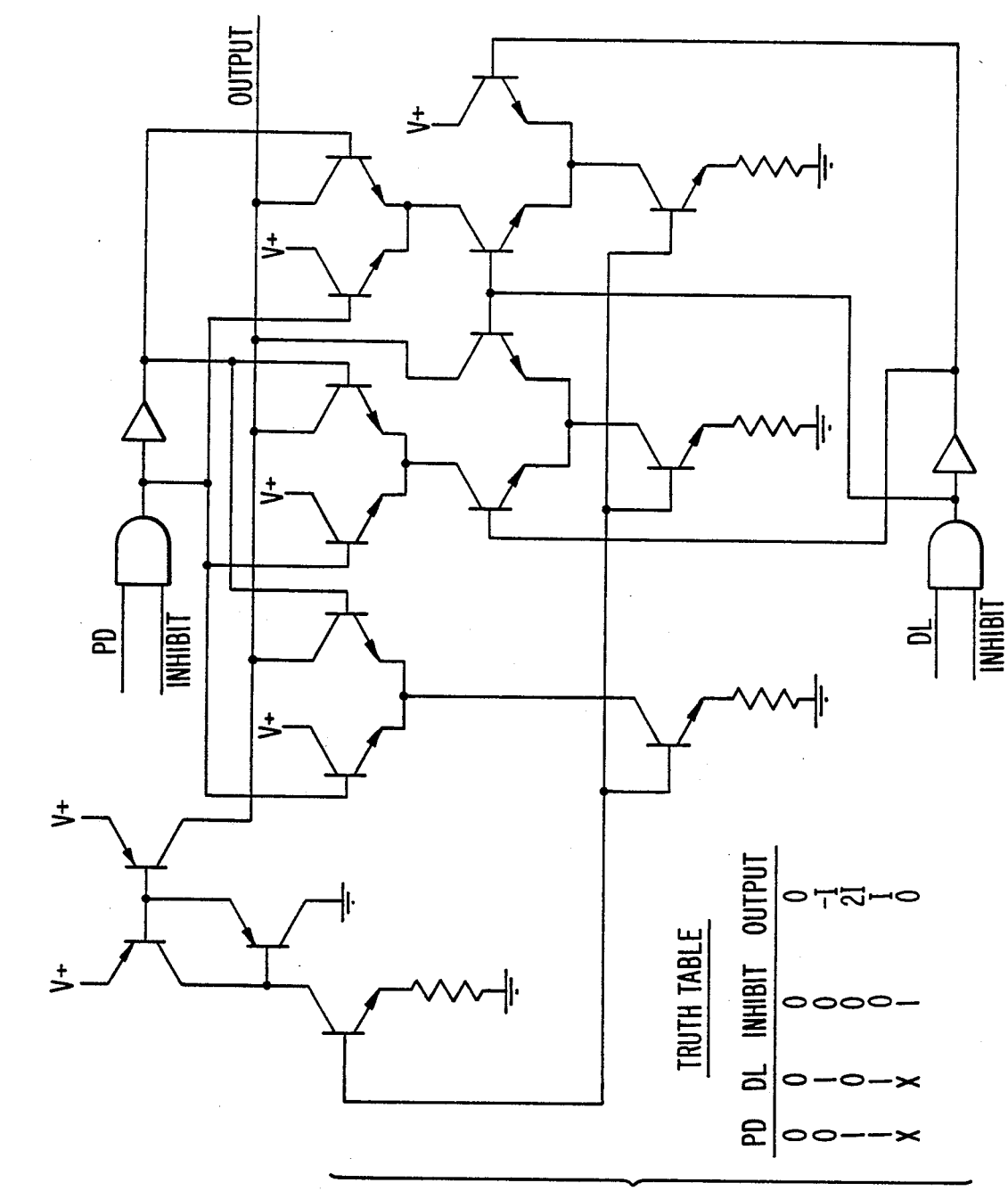
FIGS. 6-7 show detailed circuitry of the current pumps of FIG. 4 with their truth tables.

The PLL of the preferred embodiment utilizes a 180 degree phase difference between the incoming NRZ data and the recovered clock. Therefore, the data is strobed in the center of the data pulse, thus providing the best strobe point for recovery of input data, thus improving the data error rate. This 180 degree phase difference is accomplished by current pump 54. The truth table and detailed circuitry of current pump 54 is shown in FIG. 6. Current pump 54 responds to inputs from phase detector 52 (PD input) and data latch 54 (DL input), as well as inhibit line 32 from monitor circuitry 20, as shown in the truth table in FIG. 6. When a missing pulse occurs in the NRZ data stream, PD input is 0 and DL input is 0. Current pump 54 output is then 0, thereby preventing a massive phase error at the current pump output due to the missing pulse. Current pump 54 stays off (output is 0) until the resumption of data pulses. Upon receipt of the first pulse after a sequence of missing pulses, current pump 54 output is double in amplitude (2I) to correct an additional phase error created by the delay of data latch 53. Subsequent pulses from the NRZ data stream result in the output of current pump 54 switching between −I and I when "0" and "1" is received, respectively.

AND gate 59 and delay 58 reshape the output of VCO 16 so that narrow pulses are supplied on output line 57 to phase detector 52, thus completing the loop of PLL circuit 50.

Figure 7:
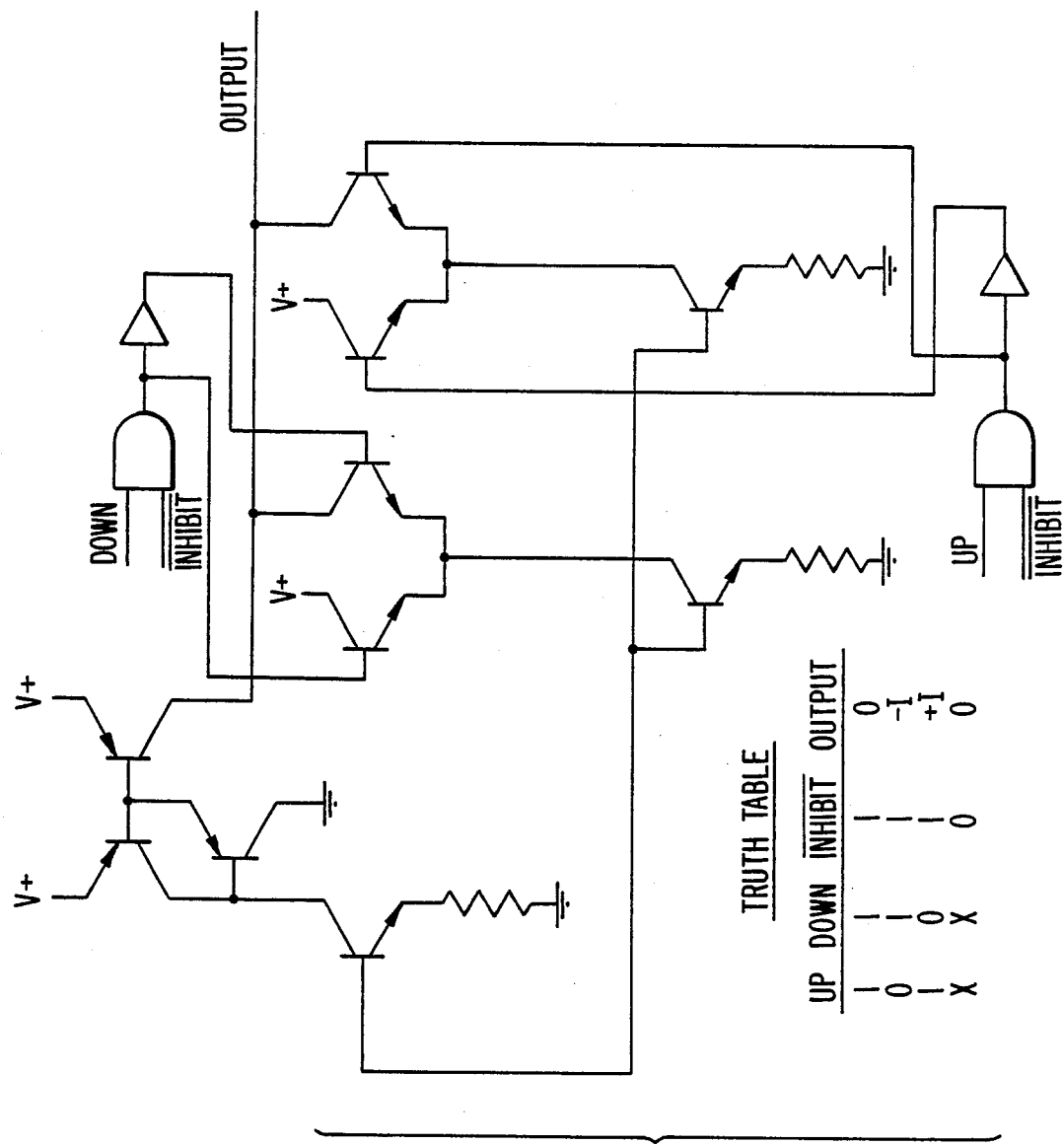

Phase detector 52 has a narrow acquisition range centered around the base frequency of the NRZ data stream. This narrow acquisition range is especially critical with random NRZ data streams, since there will be many spectral harmonic frequencies close to the base frequency. Monitor circuitry 20 operates as discussed previously to monitor the phase locked loop circuit, and enables inhibit line 32 if it determines that the phase locked loop circuit 50 is operating beyond the frequency window. When inhibit line 32 is enabled, current pump 54 is turned off, thus turning off phase detector 52. Current pump 61 is then turned on, and phase frequency detector 62 and current pump 61 replace phase detector 52 and current pump 54 in PLL circuit 50. The truth table and detailed circuitry of current pump 61 is shown in FIG. 7. As before, phase frequency detector 62 has a wide acquisition range, and is controlled by frequency reference signal 22, which operates at a frequency corresponding to the base frequency of the incoming NRZ data stream. Phase frequency detector 62 and current pump 61 operate to bring PLL circuit 50 back within the frequency window, and thus acquisition range of phase detector 52. When monitor 20 detects that this event has occurred, inhibit line 32 is disabled, thus turning off current pump 61 and associated phase frequency detector 62 and turning on current pump 54 and associated phase detector 52. Phase detector 52 then locks in on the frequency of the incoming NRZ data stream doubled by frequency doubler 51.

While the invention has been described with respect to a preferred embodiment thereof, it will be understood by those skilled in the art that various changes in detail may be made therein without departing from the spirit, scope, and teaching of the invention. For example, the disclosed monitor and lock recovery circuitry could be used with any phased locked loop application requiring initialization of a loop on code containing a large spread of harmonic content, regardless of the code sent or its frequency. The disclosed circuitry is especially beneficial for high speed applications, such as optical data transmission, and is not limited by existing coding schemes, such as return to zero, non return to zero, split phase, etc. Accordingly, the herein disclosed is to be limited only as specified in the following claims.

What is claimed is:

1. A monitor/recovery circuit for monitoring a phase locked loop circuit and for recovering the operation of said phase locked loop circuit inside a predetermined frequency window, said phase locked loop circuit including an input, a phase detector having a narrow acquisition range, a first low pass filter, a voltage controlled oscillator and an output, said monitor/recovery circuit comprising:
   monitor means, connected to said output of said phase locked loop and to said phase detector, for monitoring said phase locked loop and for outputting a first control signal when said phase locked loop circuit is operating outside said predetermined frequency window and for outputting a second control signal when said phase locked loop circuit is operating inside said predetermined frequency window, said phase detector being enabled responsive to said second control signal, said monitor means comprising:
      a first frequency reference signal,
      comparing means connected to said phase locked loop circuit output and said first frequency reference signal for comparing the output frequency of said phase lock loop circuit with said first reference signal frequency; and
      detecting means, connected to said comparing means, for detecting when the difference between said output frequency and said first reference frequency exceeds said predetermined frequency window, thereby generating said first control signal,
      said detecting means generating said second control signal when the difference between said output frequency and said first reference frequency does not exceed said predetermined frequency window; and
   recovery means, connected to said monitor means and to an input of said low pass filter and enabled responsive to said first control signal, for recovering the operation of said phase locked loop circuit when said phse locked loop circuit is inside said predetermined frequency window, said recovery means comprising:
      a first phase frequency detector having a wide acquisition range and having a first and second input and an output, said first input connected to said first frequency reference signal and said second input connected to said output of said phase locked loop circuit.

2. The monitor/recovery circuit of claim 1, wherein said comparing means comprises:
   an exclusive OR circuit having a first and second input and an output, connected at said first input to said reference signal and at said second input to said phase locked loop circuit output, wherein an analog representation of the sum and difference of said exclusive OR circuit input signals is present at said exclusive OR circuit output;
   a second low pass filter, connected to said exclusive OR circuit output for filtering out the sum of said exclusive OR input signals; and
   a comparator, connected to said low pass filter, for transforming the analog difference of said exclusive OR input signals into a digital signal.

3. The monitor/recovery circuit of claim 2, wherein said detecting means comprises: a second phase frequency detector having a first and second input and an output, connected at said first input to said comparator and at said second input to a second frequency reference signal having the same frequency as said predetermined frequency window, said first and second control signals being generated at said second phase frequency detector output.

4. The monitor/recovery circuit of claim 3, wherein said detecting means further comprises:
   a retriggerable single shot, connected to said second phase frequency detector.

5. The monitor/recovery circuit of claim 4, wherein said second frequency reference signal is generated by a divider circuit connected to said first frequency reference signal, said divider circuit selected so that said frequency window is less than said narrow acquisition range of said phase detector.

6. A method for monitoring a phase locked loop circuit having an input for receiving data, a phase detector having a narrow acquisition range, a low pass filter, a voltage controlled oscillator, and an output, comprising the steps of:
   subtracting the frequency of the output of said phase locked loop circuit from a first frequency reference signal corresponding to the rate of transmission of said data;
   comparing said subtracted frequency signal with a second frequency reference signal less than the acquisition range of said phase detector;
   generating a first control signal if said subtracted frequency exceeds said second frequency reference signal, thereby indicating that said phase locked loop circuit is out of lock;
   disabling said phase detector, responsive to said first control signal; and
   enabling a first phase frequency detector having a wide acquisition range, also responsive to said first control signal,
   said first phase frequency detector being controlled by said first frequency reference signal so that said phase locked loop circuit converges towards said first reference signal.

7. The method of claim 6, further comprising the steps of:
   generating a second control signal if said second frequency reference signal exceeds said subtracted frequency, thereby indicating that said phase locked loop circuit is within a predetermined frequency window;

enabling said phase detector, responsive to said second control signal; and
disabling said first phase frequency detector also responsive to said second control signal.

8. A circuit for extracting clocking information from an NRZ data stream, comprising:
a phase locked loop circuit having an input for said NRZ data stream and an output, comprising a phase detector having a narrow acquisition range, a first current pump connected to said phase detector, a low pass filter connected to said first current pump, and a voltage controlled oscillator connected to said low pass filter and coupled to said phase detector;
monitor means, connected to said phase detector and said output of said phase locked loop circuit, for monitoring said phase locked loop and for outputting a first control signal when said phase locked loop circuit is operating outside a predetermined narrow frequency window an for outputting a second control signal when said phase locked loop circuit is operating inside said predetermined frequency window; and
recovery means, connected to said monitor means and to an input of said low pass filter, and enabled responsive to said first control signal for recovering the operation of said phase locked loop circuit when said phase locked loop circuit is inside said predetermined frequency window,
said phase detector being enabled responsive to said second control signal.

9. A circuit for extracting clocking information from a NRZ data stream, comprising:
a phase locked loop circuit having an input for said NRZ data stream and an output, comprising a phase detector having a narrow acquisition range, a first current pump connected to said phase detector, a low pass filter connected to said first current pump, and a voltage controlled oscillator connected to said low pass filter and coupled to said phase detector;
monitor means, connected to said phase detector and said output of said phase locked loop circuit, for monitoring said phase locked loop and for outputting a first control signal when said phase locked loop circuit is operating outside a predetermined narrow frequency window and for outputting a second control signal when said phase locked loop circuit is operting inside said predetermined frequency window; and
recovery means, connected to said monitor means and to an input of said low pass filter, and enabled responsive to said first control signal for recovering the operation of said phase locked loop circuit when said phase locked loop circuit is inside said predetermined frequency window,
said phase detector being enabled responsive to said second control signal;
wherein said phase detector is a set/reset latch.

10. The circuit of claim 9, wherein said first current pump is turned off when a plurality of missing pulses are received.

11. The circuit of claim 10, wherein the output signal of said first current pump, upon the current pump receiving a first pulse after a plurality of missing pulses is twice the magnitude of the output signal of said first current pump, upon receipt of subsequent pulses after said first pulse.

12. The monitor/recovery circuit of claim 11, wherein said monitor means comprises:
a first frequency reference signal,
comparing means connected to said phase locked loop circuit output and said first frequency reference signal for comparing the output frequency of said phase lock loop circuit with said first reference signal frequency; and
detecting means, connected to said comparing means, for detecting when the difference between said output frequency and said first reference frequency exceeds said predetermined frequency window, thereby generating said first control signal,
said detecting means generating said second control signal when the difference between said output frequency and said first reference frequency does not exceed said predetermined frequency window.

13. The monitor/recovery circuit of claim 12 wherein said recovery means comprises:
a first phase frequency detector having a wide acquisition range and having a first and second input and an output, said first input connected to said first frequency reference signal and said second input connected to said output of said phase locked loop circuit; and
a second current pump.

14. The monitor/recovery circuit of claim 13, wherein said comparing means comprises:
an exclusive OR circuit having a first and second input and an output, connected at said first input to said reference signal and at said second input to said phase locked loop circuit output, wherein an analog representation of the sum and difference of said exclusive OR circuit input signals is present at said exclusive OR circuit output;
a second low pass filter, connected to said exclusive OR circuit output for filtering out the sum of said exclusive OR input signals; and
a comparator, connected to said low pass filter, for transforming the analog difference of said exclusive OR input signals into a digital signal.

15. The monitor/recovery circuit of claim 14, wherein said detecting means comprises:
a second phase frequency detector having a first and second input and an output, connected at said first input to said comparator and at said second input to a second frequency reference signal having the same frequency as said predetermined frequency window, said first and second control signals being generated at said second phase frequency detector output.

16. The monitor/recovery circuit of claim 15, wherein said detecting means further comprises:
a retriggerable single shot, connected to said second phase frequency detector.

17. The monitor/recovery circuit of claim 16, wherein said second frequency reference signal is generated by a divider circuit connected to said first frequency reference signal, said divider circuit selected so that said frequency window is less than said narrow acquisition range of said phase detector.

* * * * *